United States Patent
Yu

(12) 
(10) Patent No.: US 6,475,869 B1
(45) Date of Patent: Nov. 5, 2002

(54) METHOD OF FORMING A DOUBLE GATE TRANSISTOR HAVING AN EPITAXIAL SILICON/GERMANIUM CHANNEL REGION

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/793,055

(22) Filed: Feb. 26, 2001

(51) Int. Cl.$^7$ .............................................. H01L 21/336
(52) U.S. Cl. ........................ 438/303; 438/156; 438/164; 438/173; 438/197; 438/304; 438/595
(58) Field of Search ................... 438/149, 151, 438/156, 157, 164, 173, 176, 197, 182, 212, 222, 267, 268, 269, 286, 299, 300, 303, 304, 479, 574, 585, 588, 590, 592, 595

(56) References Cited

U.S. PATENT DOCUMENTS

| | | | |
|---|---|---|---|
| 4,697,333 A | 10/1987 | Nakahara | |
| 4,994,866 A | 2/1991 | Awano | |
| 5,019,882 A | 5/1991 | Solomon et al. | |
| 5,155,571 A | 10/1992 | Wang et al. | |
| 5,360,749 A | 11/1994 | Anjum et al. | |
| 5,461,250 A | 10/1995 | Burghartz et al. | |
| 5,591,653 A * | 1/1997 | Sameshima et al. | 438/163 |
| 5,683,934 A | 11/1997 | Candelaria | |
| 5,753,541 A | 5/1998 | Shimizu | |
| 5,760,442 A | 6/1998 | Shigyo et al. | |
| 5,766,989 A | 6/1998 | Maegawa et al. | |
| 5,910,015 A | 6/1999 | Sameshima et al. | |
| 5,981,345 A * | 11/1999 | Ryum et al. | 438/303 |
| 6,022,785 A | 2/2000 | Yeh et al. | |
| 6,124,614 A | 9/2000 | Ryum et al. | |
| 6,133,082 A | 10/2000 | Masuoka | |
| 6,232,622 B1 | 5/2001 | Hamada | |
| 6,268,640 B1 | 7/2001 | Park et al. | |

OTHER PUBLICATIONS

"Sub–50 nm P–Channel FinFET", Huang et al., IEEE Transactions on Electron Devices, vol. 48, No. 5, May 2001, pp. 880–882.

U.S. Ser. No. 09/633,209 filed Aug. 7, 2000 entitled "Double Gate Transistor having a Silicon/Germanium Channel Region".

U.S. Ser. No. 09/633,312 filed Aug. 7, 2000 entitled "Double Gate Transistor Formed in a Thermal Process".

U.S. Ser. No. 09/599,141 filed Jun. 22, 2000 entitled "A Process for Manufacturing Transistors having Silicon/Germanium Channel Region".

U.S. Ser. No. 09/599,270 filed Jun. 22, 2000 entitled "A Solid Phase Epitaxy Process for Manufacturing Silicon/Germanium Channel Regions".

* cited by examiner

Primary Examiner—Chandra Chaudhari
Assistant Examiner—Jack Chen
(74) Attorney, Agent, or Firm—Foley & Lardner

(57) ABSTRACT

A method of manufacturing an integrated circuit with a channel region containing germanium. The method can provide a double planar gate structure. The gate structure can be provided over lateral sidewalls of channel region. The semiconductor material containing germanium can increase the charge mobility associated with the transistor. An epitaxy process can form the channel region. A silicon-on-insulator can be used.

20 Claims, 2 Drawing Sheets

METHOD OF FORMING A DOUBLE GATE TRANSISTOR HAVING AN EPITAXIAL SILICON/GERMANIUM CHANNEL REGION

CROSS REFERENCE TO RELATED APPLICATIONS

The present application is related to U.S. application Ser. No. 09/633,209, filed on Aug. 7, 2000, by Yu, entitled "Double Gate Transistor Having a Silicon/Germanium Channel Region"; U.S. application Ser. No. 09/633,312 filed on Aug. 7, 2000, by Yu, entitled "Double Gate Transistor Formed In A Thermal Process,"; both assigned to the assignee of the present application. The present application is also related to U.S. application Ser. No. 09/599,141, filed on Jun. 22, 2000, by Yu, entitle "A Process For Manufacturing Transistors Having Silicon/Germanium Channel Regions," and U.S. application Ser. No. 09/599,270, filed on Jun. 22, 2000, by Yu entitled "A Solid Phase Epitaxy Process for Manufacturing Silicon/Germanium Channel Regions," assigned to the Assignee of the present application.

FIELD OF THE INVENTION

The present invention relates generally to integrated circuits (ICs) and methods of manufacturing integrated circuits. More particularly, the present invention relates to a method of manufacturing integrated circuits having transistors with a specialized channel regions and a double gate structure.

BACKGROUND OF THE INVENTION

Integrated circuits (ICs), such as, ultra-large-scale integrated (ULSI) circuits, can include as many as one million transistors or more. The ULSI circuit can include complementary metal oxide semiconductor (CMOS) field effect transistors (FETS). The transistors can include semiconductor gates disposed above a channel region and between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-inducted barrier-lowering. Shallow source and drain extensions, and hence controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion implantation process. Without the sidewall spacers, the doping process introduces dopants into a thin region just below the top surface of the substrate to form the drain and source extensions as well as to partially form the drain and source regions.

After the drain and source extensions are formed, silicon dioxide spacers, which abut lateral sides of the gate structure, are provided over the source and drain extensions. With the silicon dioxide spacers in place, the substrate is doped a second time to form deep source and drain regions. During formation of the deep source and drain regions, further doping of the source and drain extensions is inhibited due to the blocking characteristic of the silicon dioxide spacers. The deep source and drain regions are necessary to provide sufficient material to connect contacts to the source and drain regions.

As transistors become smaller, it is desirous to increase the charge carrier mobility in the channel region. Increasing charge carrier mobility increases the switching speed of the transistor. Channel regions formed from materials other than silicon have been proposed to increase charge carrier mobility. For example, conventional thin film transistors which typically utilize polysilicon channel regions have been formed on a silicon germanium (Si—Ge) epitaxial layer above a glass ($SiO_2$) substrate. The Si—Ge epitaxial layer can be formed by a technique in which a semiconductor thin film, such as, an amorphous silicon hydride (a-Si:H), an amorphous germanium hydride (a-Ge:H) or the like is melted and crystallized by the irradiation of pulse laser beams.

In a bulk type device, such as, a metal oxide semiconductor field effect transistor (MOSFET), the use of Si—Ge materials could be used to increase charge carrier mobility, especially hole-type carriers. A tensile strained silicon region, such as, a silicon channel containing germanium, can have carrier mobility 2–5 times greater than a conventional Si channel region due to reduced carrier scattering and due to the reduced mass of holes in the germanium-containing material. According to conventional Si—Ge formation techniques for bulk-type devices, a dopant implant molecular beam epitaxy (MBE) technique forms a Si—Ge epitaxial layer. However, the MBE technique requires very complicated, very expensive equipment and is not feasible for mass production of ICs.

Double gate transistors, such as, double gate silicon-on-insulator (SOI) transistors have significant advantages related to high drive current and high immunity to short channel effects. An article by Huang, et al. entitled "Sub-50 nm FinFET: PMOS", (1999 IEDM) discusses a silicon transistor in which the active layer is surrounded by a gate on two sides. However, double gate structures can be difficult to manufacture using conventional IC fabrication tools and techniques.

Thus, there is a need for an integrated circuit or electronic device that includes channel regions with higher channel mobility, higher immunity to short channel effects and higher drive current. Further, there is a need for transistors with a thin epitaxial Si—Ge channel region and deep source and drain regions. Even further, there is a need for a method of manufacturing a transistor having a thin epitaxial Si—Ge channel region in a semiconductor substrate. Yet further, there is a need for a method of fabricating a double gate transistor having an epitaxial silicon/germanium channel. Yet even further, there is a need for an efficient method of manufacturing a double gate transistor having a channel containing germanium.

SUMMARY OF THE INVENTION

The exemplary embodiment relates to a method of manufacturing an integrated circuit on a substrate. The method includes providing fin area in the substrate, providing silicon/germanium material on sidewalls of the fin area, and providing a dielectric layer over the silicon/germanium material. The method also includes providing a gate conductor over the dielectric layer.

Another exemplary embodiment relates to a transistor. The transistor includes a gate conductor disposed above a fin region of a silicon-on-insulator substrate, a dielectric layer, and a silicon/germanium layer. The gate conductor is above a top side and two lateral sides of the fin region. The dielectric layer is below the first gate conductor and above the fin region. The silicon/germanium layer is disposed on lateral sides of the fin region and below the dielectric layer.

Another exemplary embodiment relates to a process of forming a transistor. The transistor has a semiconductor/germanium channel region. The process includes an island of semiconductor material on a substrate, forming a single crystalline semiconductor/germanium, and providing a gate structure over at least a portion of the island. The island has a cap layer. The method also includes steps of growing oxide sidewalls on the island and removing the oxide sidewalls. The single crystalline semiconductor/germanium layer is provided on sidewalls of the island after the oxide sidewalls have been removed.

BRIEF DESCRIPTION OF THE DRAWINGS

Exemplary embodiments will hereafter be described with reference to the accompanying drawings, wherein like numerals denote like elements, and.

DETAILED DESCRIPTION OF THE PREFERRED EMBODIMENTS

Figure 1:
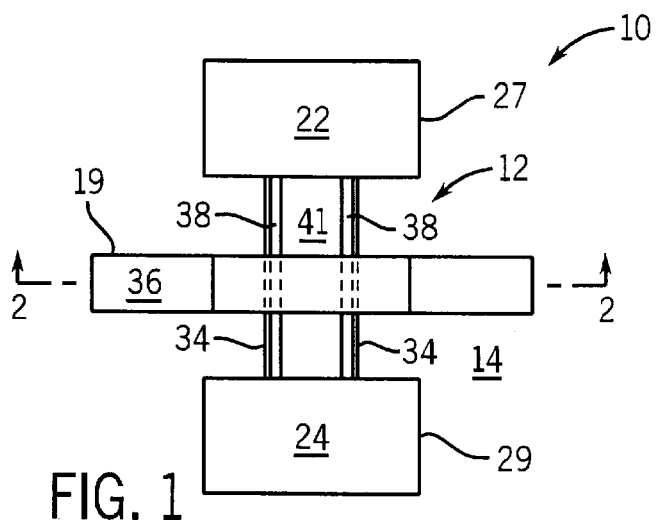
FIG. 1 is a schematic planar top view representation of a portion of an integrated circuit in accordance with an exemplary embodiment, the integrated circuit includes a transistor.
Figure 2:
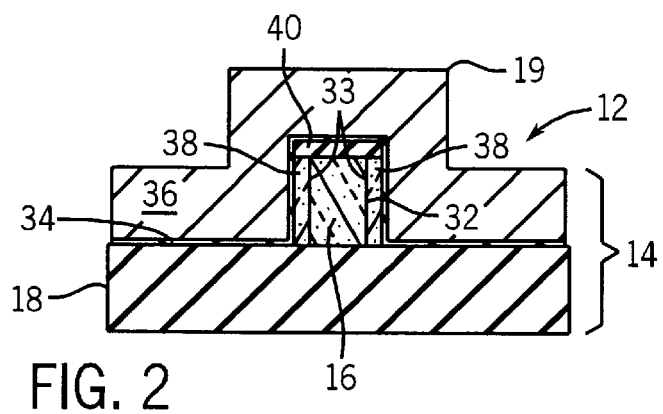
FIG. 2 is a schematic cross-sectional view representation of the portion of the integrated circuit illustrated in FIG. 1 about line 2—2 in accordance with an exemplary embodiment, the transistor having a channel region which includes a semiconductor/germanium material.

With reference to FIGS. 1 and 2, a portion 10 of an integrated circuit (IC) includes a transistor 12 which is disposed on a semiconductor substrate 14, such as, a wafer. Semiconductor substrate 14 is preferably a semiconductor-on-insulator (SOI) substrate, (preferably silicon-on-glass). Alternatively, substrate 14 can be an N-type well in a P-type substrate, an insulative substrate, a bulk P-type single crystalline (001) silicon substrate or other suitable material for transistor 12.

Transistor 12 can be a P-channel or N-channel metal oxide semiconductor field effect transistor (MOSFET). Transistor 12 is preferably embodied as a fully depleted (FD), double planar gate, SOI MOSFET and includes a gate structure 19, a source region 22, and a drain region 24. Gate structure 19 advantageously provides a double gate structure that provides increased drive current and high immunity to short channel effects.

Substrate 14 preferably includes a thin film semiconductor layer 16 and a buried insulative layer 18. Layer 16 can be a 50 to 80 nm thick layer of semiconductor material, such as single crystal silicon. Layer 18 can be a buried oxide layer such as a 1000 Å to 4000 Å thick silicon dioxide layer. Substrate 14 can be manufactured from a conventional silicon wafer or can be purchased as a standard SOI wafer.

Regions 22 and 24 are disposed on a portion 27 and a portion 29 of substrate 14. Regions 22 and 24 are preferably disposed in a fin area or island 32 associated with layer 16. Island 32 is preferably 50–80 nm in height and 10–30 nm wide. Island 32 can also be referred to as a fin area.

Island 32 also includes a cap layer 40. Preferably, cap layer 40 is a 15–20 nm thick silicon nitride layer. Cap layer can be 15–40 nm wide.

Gate structure 19 can also include a pair of sidewall spacers. Spacers can be manufactured in a conventional deposition and etch-back process. Alternatively, other insulative material such as silicon nitride can be utilized to form spacers. The spacers can be located between region 22 and conductor 36 and between region 24 and conductor 36.

Regions 22 and 24 can have 400–1000 Å junction depth and can include a source extension and a drain extension. For an N-channel transistor, regions 22 and 24 are heavily doped with N-type dopants (e.g., $5 \times 10^{19}$–$1 \times 10^{20}$ dopants per cubic centimeter). For a P-channel transistor, regions 22 and 24 are heavily doped with P-type dopants (e.g., $5 \times 10^{19}$–$1 \times 10^{20}$ dopants per cubic centimeter). Appropriate dopants for a P-channel transistor include boron, boron diflouride, or iridium, and appropriate dopants for an N-channel transistor include arsenic, phosphorous, or antimony.

Gate shack or structure 18 includes a gate dielectric layer 34 and a gate conductor 36. Dielectric layer 34 is preferably comprised of a thermally grown, 15–25 Å thick silicon dioxide layer. Alternatively, deposited silicon nitride ($Si_3N_4$) material or high-K gate dielectric materials can be utilized for layer 34.

Conductor 36 is preferably a 500–2000 Å thick polysilicon layer. Conductor 36 can be heavily doped (P+ or N+) polysilicon. Alternatively, conductor 36 can include metal, such as a refractory metal. Conductor 36 can include germanium to adjust the work function of transistor 12.

Gate structure 19 has a height or thickness of 500–2000 Å. Gate structure 19 (conductor 36 and layer 34) is U-shaped in cross-section (FIG. 2) and surrounds at least three sides of island 32. Island 32 is associated with a channel region 41 between source region 22 and drain region 24. Island 32 includes sidewalls 33 that are covered by a semiconductor/germanium material.

Semiconductor/germanium material 38 can extend from region 22 to region 24. Material 38 can be rectangular in cross section (FIG. 2) having dimensions of 5–10 nm×50–80 nm. Preferably, material 38 on sidewalls 33 is silicon/germanium. Thus, channel region 41 is comprised of a compound structure including material 38 and at least portions of island 32.

Semiconductor/germanium material 38 advantageously provides germanium for channel region 41, thereby increasing carrier mobility for transistor 12.

The use of material 38 including germanium allows the mobility of carriers to be approximately 2–5 times larger than if channel region 41 were comprised solely of silicon material. The mechanical stress associated with material 38 increases the carrier mobility for channel 41 (e.g., stress-enhanced mobility).

A silicide layer can be formed in regions 22 and 24. The silicide layer can be deposited or sputtered on top of source region 22 and drain region 24 for connection to contacts. Metal contacts can be coupled to regions 22 and 24 via the silicide layer. Conventional metal silicidation techniques can be utilized. For example, titanium silicide, cobalt silicide, tungsten silicide, and other silicides can be utilized.

With reference to FIGS. 1–8, the fabrication of transistor 12, including channel region 41, is described as follows. The advantageous process allows channel region 41 to include germanium and yet does not require MBE equipment. The process also allows dual gate structure 19 to be efficiently formed.

Figure 3:
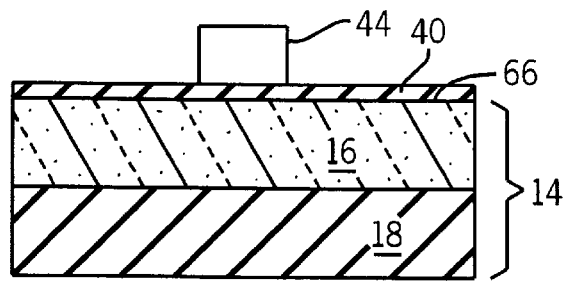
FIG. 3 is a cross-sectional view representation of the portion of the integrated circuit illustrated in FIG. 1, showing a lithographic step.

In FIG. 3, SOI substrate 14 includes a 50–80 nm thin film or layer 16 above a buried oxide layer 18. Substrate 14 can be provided as part of a semiconductor wafer. Substrate 14 can include a planarized top surface 66 of layer 16.

A cap layer 40 is deposited by chemical vapor deposition (CVD) above surface 66. Layer 40 can be deposited as a 15–20 nm silicon nitride cap layer.

After deposition of layer 40, a photoresist layer is provided above layer 40 and patterned according to a conventional lithographic process. Preferably, the photoresist layer is patterned to provide a 15–40 nm wide photoresist feature 44. Layer 40 can serve as an anti-reflective coating during patterning the photoresist layer to form feature 44. Any process for forming feature 44 can be utilized without departing from the scope of the invention. The preferred process is conventional photolithography.

Figure 4:
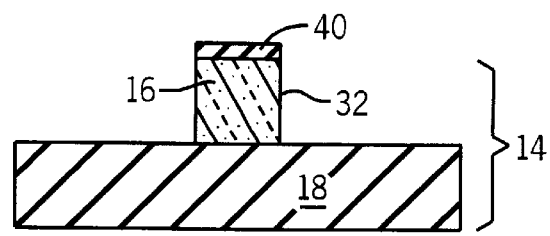
FIG. 4 is a cross-sectional view representation of the portion of the integrated circuit illustrated in FIG. 3, showing an etching step.

In FIG. 4, layer 40 and layer 16 are removed in accordance with feature 44. Preferably, an etching step is utilized to form a 15–40 nm wide stack of layer 40 and layer 16. Preferably, plasma dry etching selective to silicon nitride and silicon and not selective to silicon dioxide is utilized to form fin area or island 32 beneath layer 40.

Figure 5:
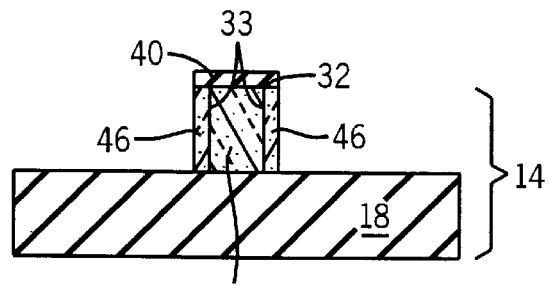
FIG. 5 is a cross-sectional view representation of the portion of the integrated circuit illustrated in FIG. 4, showing an oxide growth step.

In FIG. 5, material 46 is grown on sidewalls 33 of island 32. Preferably, material 46 is an oxide material, such as, silicon dioxide. Material 46 can be thermally grown to a thickness (left-to-right) of 5–10 nm.

Figure 6:
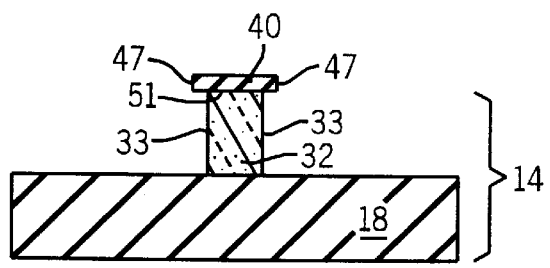
FIG. 6 is a cross-sectional view representation of the portion of the integrated circuit illustrated in FIG. 5, showing an oxide removal step.

In FIG. 6, material 46 is removed from sidewalls 33 of island 32. Material 46 (FIG. 5) can be removed in a time-controlled wet etch. The etch can utilize a hydrogen fluoride (HF) solution. Preferably, full removal of material 46 is achieved while removing little of island 32. The buried oxide will be etched a little, but has no impact on device operation. After removal of material 46, layer 40 extends 5–10 nm from sidewalls 33 at ends 47. Layer 40 protects a top surface 51 of island 32 during the step which removes material 46.

Figure 7:
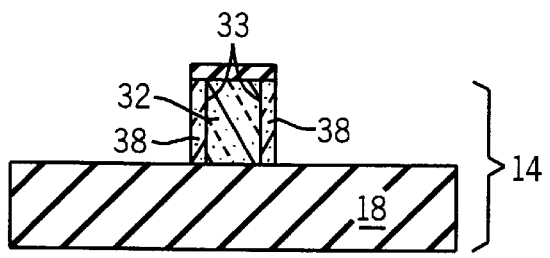
FIG. 7 is a cross-sectional view representation of the portion of the integrated circuit illustrated in FIG. 6, showing a semiconductor/germanium material epitaxy step.

In FIG. 7, semiconductor/germanium material 38 is grown on sidewalls 33 of island 32. Preferably, semiconductor/germanium material is silicon germanium laterally grown by epitaxy. The material is a thin layer (5–10 nm thick, left-to-right) layer of undoped silicon germanium. This is selective epitaxy at relative high temperature (705–850 C), not solid-phase epitaxy. Sidewalls 33 of island 32 provide a seed or starting area for the lateral crystal growth of material 38.

In one embodiment, a solid phase epitaxy technique is utilized to crystallized material 38. Material 38 can be deposited as amorphous material in a low temperature CVD process. Solid phase epitaxy refers to a crystallization process by which an amorphous semiconductor film (silicon, silicon/germanium, or germanium) is converted into crystalline semiconductor (silicon, silicon/germanium, or germanium) of a single orientation matching the orientation of an existing crystal structure (silicon, silicon/germanium, or germanium) start layer. Solid phase epitaxy is usually achieved by heating the amorphous semiconductor layer. Alternatively, a low temperature (e.g., 550–600° C.) rapid thermal anneal can be utilized.

In another alternative, the annealing process is an excimer laser anneal process having a pulse duration of several nanoseconds and a wavelength of 308 nm. Excimer laser annealing can raise the temperature of material 38 to the melting temperature of material 38 (1100° C. for silicon). The melting temperature of material 38 in the amorphous state is significantly lower than that of island 32 which is in the crystalline state. For example, the melting temperature of amorphous silicon is 1100° C. and the melting temperature of single crystal silicon is 1400° C. Preferably, the excimer laser annealing process is controlled so that material 38 is fully melted and island 32 is not melted. After the energy associated with annealing process is removed, material 38 is recrystallized as a single crystal material.

Figure 8:
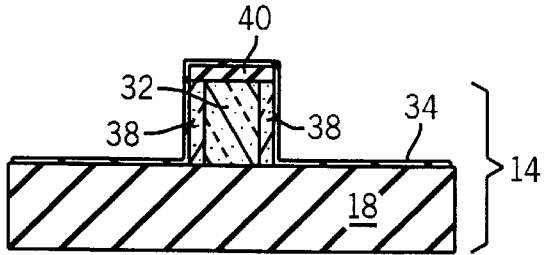
FIG. 8 is a cross-sectional view representation of the portion of the integrated circuit illustrated in FIG. 7, showing a gate dielectric deposition step.

In FIG. 8, dielectric layer 34 is deposited above buried oxide layer 18 and over island 32. Preferably, layer 34 is U-shaped in cross-section and covers material 38 and layer 40. Layer 34 can be a thin gate dielectric, such as, silicon dioxide. Alternatively, layer 34 can be silicon nitride or a high-k gate dielectric material.

In FIG. 2, gate conductor 36 is deposited over dielectric layer 34. Gate conductor 36 can be a polysilicon, polysilicon/germanium, or metal layer deposited by CVD or sputter deposition. A conventional lithographic process can be utilized to pattern conductor 36 and layer 34 in accordance with the structure shown in FIGS. 1 and 2.

After the gate structure 19 is formed, transistor 12 and integrated circuit 10 can be subjected to conventional CMOS processes to form contacts and interconnects. In addition, insulating layers can be provided over transistor 12 to otherwise complete the fabrication of portion 10.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of capping layers and semiconductor/germanium layers are shown, other structures can be utilized. Various changes may be made to the details disclosed without departing from the spirit of the invention which is defined by the following claims.

What is claimed is:

1. A method of manufacturing an integrated circuit on a substrate, the method comprising:

providing a fin area in the substrate;

narrowing a width of the fin area by growing a sacrificial material on first sidewalls of the fin area and subsequently removing the sacrificial material to form second sidewalls on the fin area;

providing silicon-germanium material on the second sidewalls of the fin area;

providing a dielectric layer over the slicon-germanium material; and providing a gate conductor over the dielectric layer.

2. The method of claim 1, further comprising:

before the providing a fin area, providing a cap layer above the substrate.

3. The method of claim 2, wherein the cap layer is silicon nitride.

4. The method of claim 2, wherein the cap layer includes ends extending above the silicon-germanium material.

5. The method of claim 3, wherein the dielectric layer is provided above the cap layer.

6. The method of claim 1, wherein the silicon-germanium material is laterally grown by epitaxy.

7. The method of claim 1, wherein the substrate includes a buried oxide layer and a single crystalline silicon thin film.

8. The method of claim 1, wherein the gate conductor surrounds at least three sides of the fin area.

9. The method of claim 1, wherein the dielectric layer is a silicon nitride.

10. The method of claim 1, wherein the silicon-germanium material is undoped.

11. A method of manufacturing an integrated circuit on a substrate, the method comprising:

providing a fin area in the substrate, the fin area having sidewalls;

providing silicon-germanium material on sidewalls of the fin area;

providing a sacrificial oxide on the sidewalls of the fin area and removing the sacrificial oxide before providing the silicon-germanium material on the sidewalls;

providing a dielectric layer over the silicon-germanium material; and providing a gate conductor over the dielectric layer.

12. The method of claim 11, wherein the gate conductor is disposed above the fin area, the gate conductor being above a top side and two lateral sides of the fin area.

13. The method of claim 11, further comprising:

providing a cap layer above the top side of the fin area.

14. The method of claim 11, wherein a source region and a drain region are disposed on ends of the fin area and the gate conductor is disposed over a middle portion of the fin area.

15. The method of claim 11, wherein the silicon-germanium material is part of a channel region.

16. The material of claim 15, wherein the silicon-germanium material is 50–100 Å thick.

17. The method of claim 16, further comprising:

providing a cap layer, the cap layer being 100–200 Å wider than the fin area at the channel region.

18. A process of forming a transistor having a semiconductor-germanium channel region, the process comprising:

forming an island of semiconductor material on a substrate, the island having a cap layer;

growing oxide material on sidewalls of the island;

removing the oxide material;

forming a single crystalline semiconductor-germanium layer on the sidewalls of the island; and providing a gate structure over at least a portion of the island.

19. The process of claim 18, further comprising:

providing a source region and a drain region on ends of the island, the ends being separated by the gate structure.

20. The process of claim 19, wherein the removing is done by wet chemical etching.

* * * * *